United States Patent [19]

Tanaka et al.

[11] Patent Number: 5,396,500
[45] Date of Patent: Mar. 7, 1995

[54] SEMICONDUCTOR INTEGRATED CIRCUIT DEVICE WITH FAULT DETECTING FUNCTION

[75] Inventors: Yoshihiro Tanaka; Yoshio Inoue, both of Itami, Japan

[73] Assignee: Mitsubishi Denki Kabushiki Kaisha, Tokyo, Japan

[21] Appl. No.: 955,655

[22] Filed: Oct. 2, 1992

[30] Foreign Application Priority Data

Oct. 3, 1991 [JP] Japan .................. 3-256346

[51] Int. Cl.⁶ ............................ H04B 17/00
[52] U.S. Cl. ...................... 371/22.1; 371/23; 324/73.1; 324/158.1
[58] Field of Search ........... 371/22.1, 15.1, 20.1, 371/22.4, 22.5, 22.6, 25.1, 27, 22.3, 22.2, 23; 324/232, 242, 262, 158 R, 73.1

[56] References Cited

U.S. PATENT DOCUMENTS

| | | | |
|---|---|---|---|
| 4,194,113 | 3/1980 | Fulks et al. | 371/20.1 |
| 4,395,767 | 7/1983 | Van Brunt et al. | 371/25.1 |
| 4,680,761 | 7/1987 | Burkness | 371/25.1 |
| 4,749,947 | 6/1988 | Gheewala | 371/15.1 |
| 4,761,607 | 8/1988 | Shiragasawa et al. | 371/25.1 |
| 4,811,344 | 3/1989 | Chauvel et al. | 371/151 |
| 4,922,445 | 5/1990 | Mizoue et al. | 371/23 |
| 4,937,826 | 6/1990 | Gheewala et al. | 371/22.1 |
| 5,065,090 | 11/1991 | Gheewala | 371/15.1 |
| 5,198,757 | 3/1993 | Azumai | 324/158 R |
| 5,202,624 | 4/1993 | Gheewala et al. | 324/158 R |

FOREIGN PATENT DOCUMENTS 0223714  5/1987  European Pat. Off. .
2441486  9/1983  Germany .

Primary Examiner—Robert W. Beausoliel, Jr.
Assistant Examiner—Dieu-Minh Le
Attorney, Agent, or Firm—Herbert R. Ruschmann; Thomas R. Morrison

[57] ABSTRACT

A logic function block having an output signal potential sensing function is substituted for each of logic function blocks of which fault conditions cannot be detected on the basis of predetermined input/output signal combinations for determining whether or not the semiconductor integrated circuit device operates correctly. Probe lines and sense lines are connected only to the logic function blocks having output signal potential sensing function. The probe lines are driven from a probe line driver, and a sense line receiver reads out signals on the sense lines. Thus, without reducing fault detecting efficiency, the areas of an active region and a wiring region required for forming a fault detecting arrangement can be reduced.

3 Claims, 3 Drawing Sheets

SEMICONDUCTOR INTEGRATED CIRCUIT DEVICE WITH FAULT DETECTING FUNCTION

BACKGROUND OF THE INVENTION

This invention relates to a semiconductor integrated circuit device with a fault detecting function which enables detection of output signal potentials of respective logic function blocks forming the integrated circuit device, and, more particularly, to such a semiconductor integrated circuit device which can detect fault conditions of the integrated circuit device itself on the basis of predetermined combinations of input/output function signals produced in response to test patterns for checking the operations of the integrated circuit device, and which can also detect fault conditions of logic function blocks that cannot be detected on the basis of the input-/output function signal combinations.

Some conventional semiconductor integrated circuit devices have a function for determining fault conditions of logic function blocks, in the integrated circuit device, based on output signals developed by the respective blocks in response to input signals applied according to predetermined test patterns. Fault conditions of only 60-70% of the entire logic function blocks can be detected using the method however, troublesome and complicated efforts are required to detect faults in the rest of the blocks.

In an effort to eliminate this problem, semiconductor integrated circuit devices with fault detecting functions have been disclosed. Disclosed examples include: "High Performance CMOS Array with an Embedded Test Structure", pages 4.1.1–4.1.4, *IEEE 1990 CUSTOM INTEGRATED CIRCUITS CONFERENCE*; "Embedded test circuitry improves fault detection in digital ASICs", *COMPUTER DESIGN*, 1 December 1989; and in an article, "CrossCheck: A cell Based VLSI Testability Solution", *26th DAC Proceedings*, 1989.

FIG. 1 shows a basic concept of the prior art devices disclosed in the above-cited articles. In the peripheral portions of an integrated circuit device generally denoted by a reference numeral 10, I/O pads 1, 1, 1 . . . 1 associated with respective sections of the integrated circuits in the device are provided. The integrated circuit device includes a plurality of sense lines 2, 2 . . . 2 and a plurality of probe lines 3, 3 . . . 3, which are used for detecting fault conditions.

The integrated circuit device includes also logic function blocks 41, 42, 43 which perform basic logic functions. As logic function blocks in the integrated circuit device, in addition to AND and NAND circuits shown in FIG. 1, OR circuits, NOR circuits and any other logic circuits can be used depending the intended functions. A probe line driver 6 is used to drive desired ones of the probe lines 3. A sense line receiver 7 reads signals from desired sense lines 2. The integrated circuit device 10 further includes input terminals 8 for applying input signals to a logic circuit comprising a plurality of logic function blocks, and an output terminal delivering an output signal from the logic circuit.

Referring to FIG. 2, the output of each of the logic function blocks 41, 42 and 43 of the conventional semiconductor integrated circuit device shown in FIG. 1, has a sense transistor 12 for sensing an output signal potential. A logic function block 4 represents any one of the logic function blocks shown in FIG. 1. An output 11 of the logic function block 4 is connected to one of the sense lines 2 through a source-drain path of the output signal potential sensing transistor 12 that has a gate connected to one of the probe lines 3. The output pin 11 is further connected to either another logic function block or output terminal 9 via a line 13.

Referring to FIGS. 1 and 2, in order to determine whether any one of the respective function blocks of the integrated circuit device exhibits a fault condition, the integrated circuit is activated to operate, and the probe lines 3 are driven by the probe line driver 6 to sequentially enable the sense transistors 12. Output signals from the respective logic function blocks 4 are read, through the associated sense transistors 12 and sense lines 2, by the sense line receiver 7. Whether the respective logic function blocks 4 are in a fault condition is determined based on the output signals read by the sense line receiver 7.

In order to improve a fault detection efficiency of conventional semiconductor integrated circuit devices with fault detecting function, the probe lines 3 and the sense lines 2 are arranged in a mesh pattern as shown in FIG. 1 so that output signal potentials from all of the logic function blocks or from as many logic function blocks as possible can be sensed. Furthermore, sense transistors for sensing output signal potentials are provided even for those logic function blocks whose fault conditions can be detected by basic input-output signal combinations produced in accordance with predetermined test patterns. Therefore, the integrated circuit device requires a large number of sense transistors, a large number of probe lines for enabling the sense transistors, a large number of sense lines for reading output signals from the logic function blocks through the sense transistors, a probe line driver, and a sense line receiver. These components disadvantageously occupy large areas of active and wiring regions.

The present invention can eliminate the above-described problem, by providing a semiconductor integrated circuit device with fault detection function occupying a reduced area of the active and wiring regions on an integrated circuit.

SUMMARY OF THE INVENTION

According to the present invention, during the design process of a semiconductor integrated circuit incorporating a fault detection function, it is determined whether there are any logic function blocks whose fault conditions cannot be detected using predetermined input/output function signal combinations. (Hereinafter, such logic function blocks are referred to as fault-undetectable logicfunction blocks.) If such a fault-undetectable logic function is required, a logic function block for sensing an output signal potential thereof, such as the one shown in FIG. 2, is used only for that fault-undetectable logic function block.

According to the present invention, only fault-undetectable logic function blocks, whose fault condition cannot be detected on the basis of input/output function signal combinations, are configured with an output signal potential sensing function, making it possible to reduce the number of sense transistors and, hence, the number of probe and sense lines for driving and monitoring sense transistors. This further enables the reduction of size a probe line driver and a sense line receiver, thus reducing of the portions of the active area and the wiring area which would otherwise be used for realizing the fault detection.

DESCRIPTION OF PREFERRED EMBODIMENTS

Figure 1:
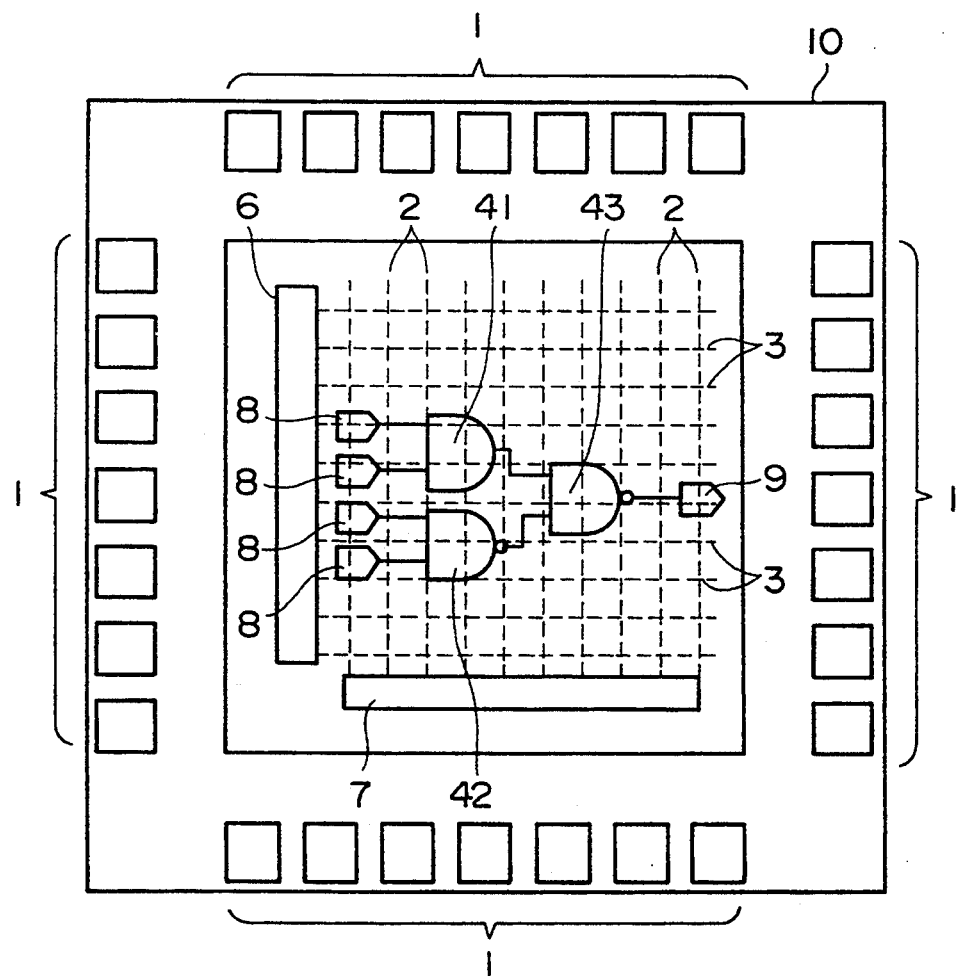
FIG. 1 is a schematic diagram showing a basic concept of a conventional semiconductor integrated circuit device with a fault detecting function.
Figure 2:
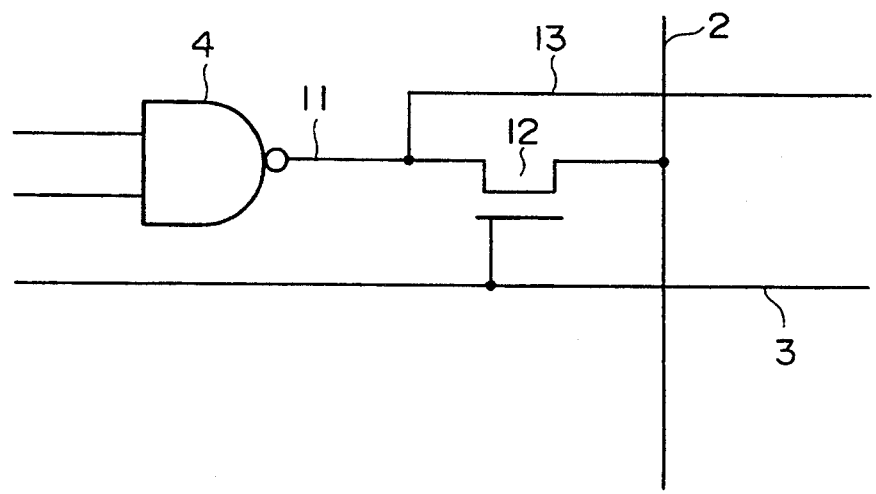
FIG. 2 is a schematic diagram of a logic function block with a sensed output signal potential.
Figure 3:
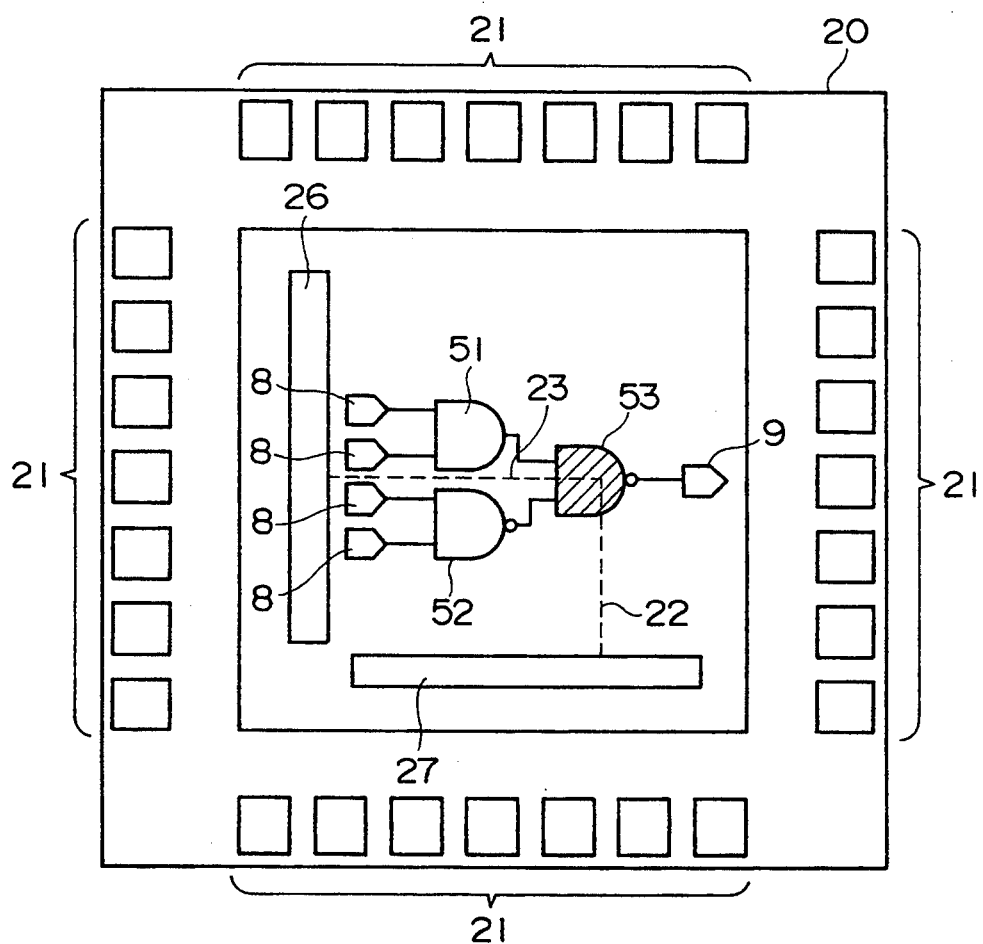
FIG. 3 is a schematic diagram showing a basic concept of a semiconductor integrated circuit device with a fault detecting function according to the present invention.

FIG. 3 shows a semiconductor integrated circuit device with fault detection function according to one embodiment of the present invention. A semiconductor integrated circuit device, generally designated by a reference numeral 20, includes I/O pads 21 associated with components disposed in the integrated circuit. The semiconductor integrated circuit device 20 of the present invention includes logic function blocks 51, 52, 53 etc. which are similar to the ones included in the conventional integrated circuit device shown in FIG. 1. For reasons discussed below, only the logic function block 53, for example, is configured as with an output signal potential sensing function including a sense transistor 12 (shown in FIG. 2). A sense line 22 and a probe line 23 are connected to the logic function block 53. Input terminals 8 apply input signals to a logic circuit formed by particular logic function blocks 51 and 52, and an output terminal 9 of a logic circuit formed by logic function block 53 delivers an output signal therefrom. The probe line 23 is connected to a probe line driver 26, and the sense line 22 is connected to a signal reading sense line receiver 27.

Figure 4:
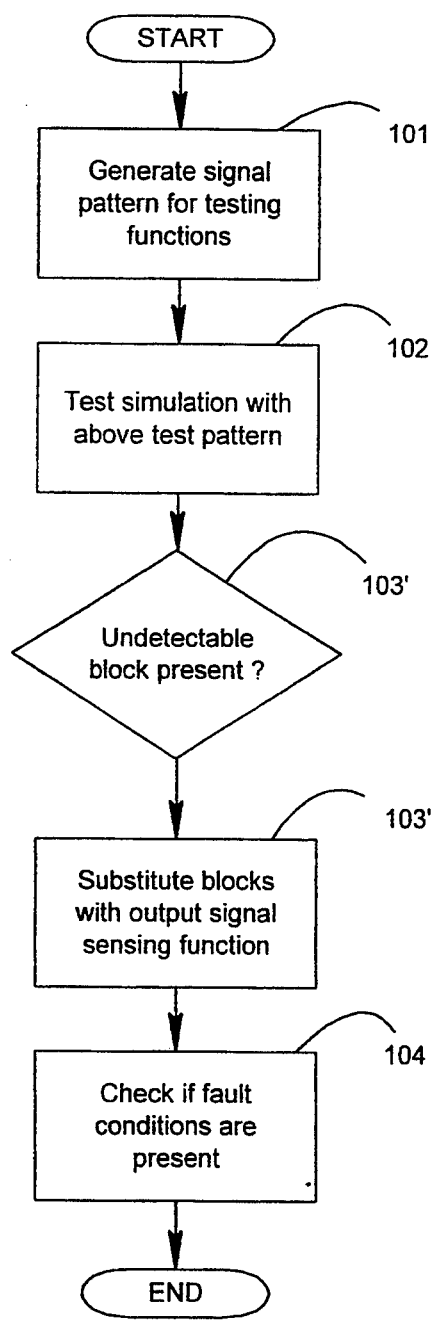
FIG. 4 is a flow chart of a design procedure determining whether particular logic function blocks are fault-detectable using predetermined input/output signal combinations, of the present invention.

The semiconductor integrated circuit device with fault detecting function of the present invention is designed and fabricated based on a production process illustrated by the flow chart shown in FIG. 4. A test to determine as to whether fault conditions of particular logic function blocks are detectable using predetermined input/output signal combinations is employed.

In a first step 101, a function testing input/output test pattern is generated to perform a fault simulation for common semiconductor integrated circuit devices.

Next, in a step 102, basic signals prepared according to the input/output test pattern are used to find, if any, the presence of fault-undetectable logic function blocks, i.e. logic function blocks of which fault conditions cannot be detected using such basic signals.

In steps 103' and 103, a logic function block with fault detecting function including a sense transistor 12, shown in FIG. 2, is substituted only for the fault-undetectable logic function block found in the step 102. In the semiconductor integrated circuit device of the present invention, shown in FIG. 3, the logic function block 53 is the with output signal potential sensing function is thus substituted.

By the above-mentioned technique, semiconductor integrated circuit devices with a fault detecting capability increased to 100%, or to a desired level, are fabricated. In a step 104, the input/output signal combinations expected for ordinary logic function blocks are used to detect if there is any fault condition in any of ordinary logic function blocks. In addition signals from logic function blocks with an output signal potential sensing function are examined to determine whether such blocks are in fault condition or not. Therefore, substantially all of the logic function blocks in the semiconductor integrated circuit device can be examined for fault conditions. Thus, the semiconductor integrated circuit device incorporating the logic function block 53 with the output signal potential sensing function for detecting a fault condition, as shown in FIG. 3, is provided.

In ordinary semiconductor integrated circuit devices, 30% to 40% of logic function blocks are ones of which fault conditions cannot be detected by means of predetermined basic signals prepared according to an input/output test pattern as used in the step 102. Accordingly, in the semiconductor integrated circuit device of the present invention, 30–40% of the logic function blocks of the device are configured as a logic function block with output signal potential sensing function as shown in FIG. 2. The remaining 60–70% of the blocks are tested using predetermined input/output signal combinations generated in response to a predetermined test pattern.

In summary, according to the present invention, only those logic function blocks, whose fault conditions cannot be be detected based on expected basic input/output signal combinations produced in response to a predetermined test pattern, are configured to have an output signal potential sensing function. This reduces the number of sense transistors, probe lines and sense lines to 30–40% relative to the conventional semiconductor integrated circuit device shown in FIG. 1. In addition, the sizes of the probe line driver and sense line receiver can be reduced. Thus, without reducing the fault detecting capability, the areas of active region and wiring region which are required for providing a fault detecting function can be reduced, thus, the effective space usable for the purpose of the integrated circuit function can be increased.

What is claimed is:

1. A method for producing an integrated circuit having a fault detection function, comprising the steps of:
   generating a signal pattern for testing functions of the integrated circuit so as to determine an existence of faults therein;
   applying the signal pattern to a fault simulation model of the integrated circuit;
   locating at least one logic block wherein a fault would be undetectable;
   replacing the at least one logic block with an output sensed logic block having a sensing means permitting detection of the fault via external examination of an output signal of the logic blocks; and
   fabricating the integrated circuit including the output sensed logic block.

2. The method for producing an integrated circuit according to claim 1 further comprising:
   testing the integrated circuit with the signal pattern; and
   activating the sensing means and testing each output sensed logic block.

3. The method for producing an integrated circuit according to claim 1 wherein the locating at least one logic block wherein a fault would be undetectable includes:
   simulating a fault in the at least one logic block; and
   determining whether detected signal indicate a fault condition.

* * * * *